(12) United States Patent
Xia et al.

(10) Patent No.: US 8,154,191 B2
(45) Date of Patent: Apr. 10, 2012

(54) SILICATE BASE LUMINESCENT MATERIALS HAVING MULTIPLE EMISSION PEAKS, PROCESSES FOR PREPARING THE SAME AND LIGHT EMITTING DEVICES USING THE SAME

(75) Inventors: Wei Xia, Liaoning (CN); Yi Xin, Liaoning (CN); Daqiang Hu, Liaoning (CN); Zhiguo Xiao, Liaoning (CN)

(73) Assignee: Luming Science And Technology Group Co., Ltd., Dalian, Liaoning (CN)

( * ) Notice: Subject to any disclaimer, the term of this patent is extended or adjusted under 35 U.S.C. 154(b) by 378 days.

(21) Appl. No.: 12/377,491

(22) PCT Filed: Aug. 15, 2007

(86) PCT No.: PCT/CN2007/002458
§ 371 (c)(1),
(2), (4) Date: Apr. 1, 2009

(87) PCT Pub. No.: WO2008/022552
PCT Pub. Date: Feb. 28, 2008

(65) Prior Publication Data
US 2010/0052513 A1    Mar. 4, 2010

(30) Foreign Application Priority Data
Aug. 15, 2006    (CN) .......................... 2006 1 0047460

(51) Int. Cl.
*H01L 33/00*    (2010.01)
*C09K 11/61*    (2006.01)
*C09K 11/79*    (2006.01)

(52) U.S. Cl. ........... 313/503; 252/301.4 R; 252/301.4 F; 252/301.4 H (58) Field of Classification Search .................. 313/503; 252/301.4 R, 301.4 F, 301.4 H
See application file for complete search history.

(56) References Cited

U.S. PATENT DOCUMENTS
7,601,276 B2 * 10/2009 Li et al. ................... 252/301.4 F
(Continued)

FOREIGN PATENT DOCUMENTS
CN    1483788 A    3/2004
(Continued)

OTHER PUBLICATIONS
EP Application No. 07785354, Supplementary European Search Report, dated Nov. 4, 2009.
(Continued)

*Primary Examiner* — Karabi Guharay
(74) *Attorney, Agent, or Firm* — Banner & Witcoff, Ltd.

(57) ABSTRACT

A silicate luminescent material excitable by an excitation light source having emissions in UV to blue light region, a process for producing the same, and a white light emitting device. The luminescent material has an emission spectrum with at least two peaks in a range of from 370 to 760 nm, and has a general chemical composition formula of $aAO \cdot bA'O \cdot cSiO_2 : xEu \cdot yLn \cdot zM \cdot \delta N$, wherein A is selected from the group consisting of Sr, Ca, Ba, and combinations thereof; A' is selected from the group consisting of Mg, Zn, and combinations thereof; Ln is selected from the group consisting of Nd, Dy, Ho, Tm, La, Ce, Er, Pr, Bi, Sm, Sn, Y, Lu, Ga, Sb, Tb, Mn, Pb and combinations thereof; M is one or a combination of halogen ions; N is selected from the group consisting of $Li^+$, $Na^+$, $K^+$, $Ag^+$, and combinations thereof; and a, b, c, x, y, z, and δ are molar coefficients.

17 Claims, 3 Drawing Sheets

U.S. PATENT DOCUMENTS

| | | |
|---|---|---|
| 2004/0159846 A1 | 8/2004 | Brown et al. |
| 2005/0093431 A1 | 5/2005 | Hancu et al. |
| 2005/0162069 A1* | 7/2005 | Ota et al. ............... 313/501 |
| 2006/0017041 A1 | 1/2006 | Tian et al. |
| 2006/0081814 A1* | 4/2006 | Shida et al. ............ 252/301.4 F |
| 2006/0145123 A1 | 7/2006 | Li et al. |
| 2008/0031797 A1* | 2/2008 | Xia et al. ............... 423/263 |
| 2009/0206729 A1* | 8/2009 | Kim et al. .............. 313/503 |
| 2010/0164360 A1* | 7/2010 | Kitamura et al. ....... 313/486 |

FOREIGN PATENT DOCUMENTS

| | | |
|---|---|---|
| CN | 1585141 A | 2/2005 |
| EP | 1616930 | 1/2006 |
| JP | 2004161982 | 6/2004 |

OTHER PUBLICATIONS

International Search Report, Nov. 2007.

* cited by examiner

SILICATE BASE LUMINESCENT MATERIALS HAVING MULTIPLE EMISSION PEAKS, PROCESSES FOR PREPARING THE SAME AND LIGHT EMITTING DEVICES USING THE SAME

CROSS REFERENCE TO RELATED APPLICATIONS:

This application is a National Stage application of co-pending PCT application PCT/CN2007/002458 filed Aug. 15, 2007, which claims the benefit of China application number 200610047460.5 filed Aug. 15, 2006. These applications are incorporated herein by reference in their entireties.

FIELD OF THE INVENTION

The present invention is in the technical field of photoelectron and semiconductor lighting and relates to a luminescent material, in particular to a luminescent material used in white light emitting devices, including semiconductor light emitting elements (such as LED), to a process for preparing the same, and to a light emitting device using the same.

BACKGROUND OF THE INVENTION

The occurrence of white light LED represents a substantive progress of LED from labeling function to lighting function. The light emitted by white light LED most closes to sunlight, and can better reflect the true color of the object under irradiation. From the view point of technology, white light LED is undoubtedly the most advanced LED technique due to its further outstanding features of no pollution, long lifetime, resistance to shock and resistance to impact, and will become a new generation of light source—the fourth generation of electric light source in the 21th century. White light LED will have a very broad range of applications.

At present, the white light LED is mostly achieved in the prior art by the methods of exciting a fluorescent material with a UV light-emitting chip or a blue light-emitting chip. However, these methods are somewhat restricted due to the limitation of the fluorescent material.

For example, patents U.S. Pat. No. 5,998,925, U.S. Pat. No. 6,998,771 and ZL00801494.9 disclose that a blue light-emitting chip is used to excite a cerium-activated rare earth garnet fluorescent material (e.g., $Y_3Al_5O_{12}$:Ce, $(Y,Gd)_3(Al,Ga)_5O_{12}$:Ce, abbreviated as YAG; or Tb-garnet, abbreviated as TAG), and yellow light emitted by the fluorescent material excited by the blue light-emitting chip mixes with a portion of the blue light from the blue light-emitting chip to produce white light. The fluorescent materials used in this method apply great restriction to the application and performance of white light LEDs. Firstly, the excitation wavelength range of such fluorescent materials is from 420 to 490 nm, and their the most effective excitation wavelength range is from 370 to 470 nm, but they are not excited by light of UV light region as well as short wavelength region and green light region of visible light. Secondly, the emission spectra of such fluorescent material powders of the rare earth garnet structure can only reach about 540 nm at the maximum and lack red light component, thereby resulting in a relatively low color rendering index of the white light LED.

For example, patents U.S. Pat. No. 6,649,946, US 20040135504, CN 1522291A, CN 1705732A, CN 1596292A, CN 1596478A, and U.S. Pat. No. 6,680,569 relate to rare earth activated nitride or oxynitride fluorescent materials that can be effectively excited in UV to blue light region. The effective excitation wavelength range of such fluorescent materials is somewhat widened, and emission range can cover from green light to red light, but the luminance of these fluorescent materials is relatively low, and the production cost thereof is relatively high. Thus, there is still great limitation to use these fluorescent materials as commercial LED phosphors.

For example, U.S. Pat. No. 6,351,069 relates to a red light-emitting sulfide fluorescent material, which can be added as a color-compensating component to white light LED, to make up color rendering index and to lower color temperature. However, the luminance of the sulfide fluorescent material is low so that it reduces the luminous efficiency of LED, although it increases the color rendering index. Moreover, said fluorescent material has poor chemical stability and ageing resistance and corrodes a chip, thereby shortening the service lifetime of the LED.

In the abovementioned patents, the methods for making white light LEDs involve the use of violet light to excite two or more phosphors, or the use of blue light-emitting chip to excite one or more phosphors, to produce white light. In particular, the use of several phosphors has a very high requirement on the consistency in application properties, such as chemical stability, luminescent property and ageing property, of different kinds of the phosphors, and the handling of the phosphors in a preparation in packaging industry is strictly restricted.

DISCLOSURES OF THE INVENTION

An object of the present invention is to provide a silicate luminescent material characterized by a broad excitation spectrum and multiple emission peaks, which has a broad excitation wavelength range (from 240 to 475 nm), at least two emission peaks in the wavelength range of from 370 to 760 nm, a high light conversion efficiency, and excellent ageing resistance. Another object of the present invention is to provide a process for producing such a silicate luminescent material. A third object of the present invention is to provide a light emitting device comprising the silicate luminescent material according to the invention, in particular a white light LED.

The main chemical composition of the silicate luminescent material according to the invention may be expressed by the following formula (1):

$$aAO.bA'O.cSiO_2:xEu.yLn.zM.\delta N \qquad (1)$$

wherein, A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Bi, Sm, Sn, Y, Lu, Ga, Sb, Tb, Mn and Pb; M is selected from the group consisting of $Cl^-$, $F^-$, $Br^-$, $I^-$, and combinations thereof; N is selected from the group consisting of $Li^+$, $Na^+$, $K^+$, and combinations thereof; a, b, c, d, x, y, z, and $\delta$ are molar coefficients, $1.0 \leq a \leq 5.0$; $0 \leq b \leq 2.0$; $0.5 \leq c \leq 2.5$; $0.001 \leq x \leq 0.2$; $0 \leq y \leq 0.5$; $0 < z < 0.5$; $0 < \delta < 0.2$; and wherein $1 \leq (a+b)/c \leq 4$. Under the excitation of a light emitting element as an excitation light source that has an emission spectrum in UV light-blue light region of from 240 to 475 nm, the luminescent material absorbs at least a portion of light from the excitation light source and thereby generates an emission spectrum having at least two peaks in a range of from 370 to 760 nm, with the emissions combining to give white light.

According to a preferred embodiment of the invention, the silicate fluorescent material has the chemical composition expressed by the formula (1), wherein A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Sm, Lu, Ga, Bi, Sb, Tb and Mn; M is selected from the group consisting of $Cl^-$, $F^-$, and combinations thereof; N is $Li^+$ and/or $Ag^+$; and wherein $1.0 \leq a \leq 4.0$; $0 \leq b \leq 2.0$; $0.7 \leq c \leq 2.2$; $0.001 \leq x \leq 0.1$; $0.0 \leq y \leq 0.25$; $0.001 \leq z \leq 0.2$; $0.001 \leq \delta < 0.1$; and $1.5 \leq (a+b)/c \leq 3$.

According to a preferred embodiment of the invention, the silicate luminescent material is excited by light from an excitation light source that has an emission peak in a UV light to bluish violet light range of from 240 to 455 nm, and generates an emission spectrum having two peaks in a range of from 370 to 760 nm.

According to a preferred embodiment of the invention, the silicate luminescent material is excited by light from an excitation light source that has an emission peak in a UV light to bluish violet light range of from 240 to 455 nm, and generates an emission spectrum having three peaks in a range of from 370 to 760 nm.

According to a preferred embodiment of the invention, the silicate luminescent material is excited by light from an excitation light source that has an emission peak in a blue light region of from 455 to 475 nm, and generates an emission spectrum having two peaks in a range of from 370 to 760 nm.

According to a preferred embodiment of the invention, the silicate luminescent material is excited by light from an excitation light source that has an emission peak in a blue light region of from 455 to 475 nm, and generates an emission spectrum having three peaks in a range of from 370 to 760 nm.

According to a preferred embodiment of the invention, the silicate luminescent material is excited by light from an excitation light source that has an emission peak in a UV light to blue light range of from 240 to 475 nm, and the emission peak wavelength of the luminescent material is longer than the wavelength of the emission peak at long wavelength side of the excitation light source.

In the present invention, the broad excitation peak and emission peak wavelength ranges of the luminescent material are achieved by finely adjusting the amounts and combination of the metal elements A and/or A' in the silicate luminescent material. The characteristics of transition between energy levels of a rare earth ion remarkably depend on its crystal structure, and this is utilized to adjust the absorption or emission wavelength of the rare earth ion to thereby generate light of different colors. In the present invention, the crystal field environment surrounding the used Eu and Ln ions in the crystal exerts a remarkable influence on 5d energy state and 4f-5d transition of these ions, so that the maximum absorption of the transition and the position of the emission peak remarkably vary as the crystal lattice environment of the substrate changes, and the emission wavelength may be finely adjusted in a range of from UV light to red light region. Moreover, by finely adjusting the amounts and combination of the metal elements A and/or A' in the silicate luminescent material, for some allomeric compounds, the position of the emission peak may shift to longer wavelength or shorter wavelength regularly as the chemical composition of the substrate changes. In the present invention, by using charge transfer (CTS) transition, i.e., transfer of an electron from a fully occupied molecular orbit of a ligand (oxygen, M, etc.) to partially occupied 4f shell layer of a rare earth ion, a relatively broad charge transfer spectrum is achieved, so that the position of a band varies as the environment changes.

In addition, the change of the concentration of Eu ion affects the main peak position of the light emitted by the fluorescent material according to the present invention. The main peak position of the light emitted by the luminescent material may also be finely adjusted by adjusting the concentrations of Eu and Ln ions.

The purpose of the incorporation of Ln in the present invention is to make use of energy transfer among rare earth ions, i.e., after light emitting centers are excited, exciting energy can transfer in the luminophor from one site to another site or from one light emitting center to another light emitting center, thereby resulting in a luminescent material having a high luminance and multiple emission peaks. An efficient radiation-free energy transfer can take place between a Eu ion and a Ln ion involved in the present invention, such as Mn ion, Ce ion, Bi ion, or the like.

The incorporation of M and N is an important discovery and innovation in the present invention. The incorporation of M can remarkably broaden the excitation spectrum range of the luminescent material and enhance the excitation band adaptability of the luminescent material, and particularly can remarkably increase the strength of the red-side emission band of the luminescent material $Eu^{2+}$. The incorporation of N may cause the crystal lattice environments surrounding the $Eu^{2+}$ ions in different substrates markedly different from each other due to that the ionic radii of alkali metals are far lower than the ionic radii of alkaline earth metals. When $Eu^{2+}$ enters a crystal lattice by substituting for an alkali metal ion, the distance between $Eu^{2+}$ and $O^{2-}$ therein is less than the distance between $Eu^{2+}$ and $O^{2-}$ in an alkaline earth metal substrate, so that the 5d energy of $Eu^{2+}$ increases, i.e., the energy difference between the lowest 5d energy level of $Eu^{2+}$ and its ground level becomes greater, and the luminescent intensity of the luminescent material is increased. The incorporation of $Ag^+$ can also markedly increase the luminescent intensity of the luminescent material, but it has a different luminescence-enhancing effect than an alkali metal ion. Meanwhile, the incorporation of N has further the effect of charge compensation.

In the production of the silicate luminescent material according to the invention, the raw materials used are compounds of individual elements in the formula (1).

$$aAO \cdot bA'O \cdot cSiO_2 : xEu \cdot yLn \cdot zM \cdot \delta N \qquad (1)$$

wherein A is selected from the group consisting of Sr, Ca, Ba, and combinations thereof; A' is selected from the group consisting of Mg, Zn, and combinations thereof; wherein a, b, c, x, y, z, and δ are molar coefficients, $1.0 \leq a \leq 5.0$; $0 \leq b \leq 2.0$; $0.5 \leq c \leq 2.5$; $0.001 \leq x \leq 0.2$; $0 \leq y \leq 0.5$; $0 < z \leq 0.5$; $0 < \delta < 0.2$; and wherein $1 \leq (a+b)c \leq 4$. In general, among the raw materials used, the compounds of A, A', Ln, N, or Eu are carbonates, sulfates, nitrates, phosphates, borates, acetates, oxalates, citrates, oxides, hydroxides, or halides of the elements represented respectively by A, A', Ln, N, or Eu; the compounds of M are halides, salts of halogenous acids, sulfides, oxide-sulfides, or sulfates of the elements represented by M; and the compounds of Si are $SiO_2$, silicic acid, silica gel, silicon nitride or silicates. The molar proportions of individual elements in the raw materials used are as follows:

A: 1.0 to 5;
A': 0 to 2.0;
Si: 0.5 to 2.5;
Eu: 0.001 to 0.2;
Ln: 0.0 to 0.5;
M: 0 to 0.5;
N: 0 to 0.2;

wherein A represents compounds of one or more of Sr, Ca and Ba; A' represents compounds of one or two of Mg and Zn; Si represents compounds of Si; Eu represents compounds of Eu; Ln represents compounds of one or more of Nd, Dy, Ho, Tm, La, Ce, Er, Pr, Bi, Sm, Sn, Y, Lu, Ga, Sb, Tb, Mn and Pb; M represents compounds of one or more of Cl, F, Br, and I; and N represents compounds of one or more of Li, Na, K and Ag.

A high temperature solid phase reaction process is used, wherein the raw materials containing the individual elements are weighed according to the molar proportions, homogenously mixed, and sintered under a reducing atmosphere (i.e., in the presence of hydrogen gas, ammonia gas, a mixture of nitrogen and hydrogen, or a particulate carbon) at a temperature of from 1000 to 1300° C. for 2 to 16 hours, depending on the volume of the furnace, the weight of the materials, and the kind and formulation of the materials; and the resultant material is then cooled, crushed, and sieved.

In order to improve the quality of the material, a minor amount (not exceeding 30% by weight of the raw materials) of other compounds, such as $NH_4Cl$, $NH_4F$, $(NH_4)_2HPO_4$, glucose, urea, $BaF_2$, $CaF_2$, $ZnF_2$, ZnS, SrS, CaS, $SrSO_4$, $SrHPO_4$, $CaHPO_4$, $Li_2CO_3$, $KNO_3$ or $Na_2CO_3$, may be added into the raw materials to participate in the solid phase reaction.

The present invention further relates to a light emitting device, comprising a light emitting element used as an excitation light source, and luminescent materials capable of converting at least a portion of light from the excitation light source, wherein:

the light emitting element has an emission spectrum with a peak in a UV light to blue light range of from 240 to 475 nm, at least a portion of the wavelengths of the first emission spectrum of the light emitting element are altered so as to give a second emission spectrum of the luminescent materials having at least two peaks in a wavelength range of from 370 to 760 nm, and at least one of the luminescent materials is the luminescent material having a chemical composition expressed by the formula (1).

In a light emitting device according to a preferred embodiment of the invention, the light emitting element as the excitation light source has at least one emission peak in the UV light to blue light range of from 240 to 475 nm in which the luminescent material has an absorption band.

In a light emitting device according to a preferred embodiment of the invention, the luminescent layer of the light emitting element is made of a nitride semiconductor or an In-containing nitride semiconductor.

In a light emitting device according to a preferred embodiment of the invention, the luminescent material used is any silicate luminescent material of the present invention.

In a light emitting device according to a preferred embodiment of the invention, the light emitting element as the excitation light source has an emission spectrum having a peak in the UV light to blue light range of from 240 to 475 nm, and the luminescent material used is one or a combination of the silicate luminescent materials of the present invention; wherein the luminescent material absorbs at least a portion of light from the excitation light source and/or from other phosphor in the combination and converts it so as to alter at least a portion of the wavelengths of the emission spectrum of the light emitting element to give a different emission spectrum having at least two peaks in the wavelength range of from 370 to 760 nm, thereby giving white light.

In a light emitting device according to a preferred embodiment of the invention, the luminescent material used further comprises a second luminescent material, and/or a third luminescent material, and/or a fourth luminescent material, which is/are used together with one or more of the silicate luminescent materials of the present invention. The second and/or the third and/or the fourth luminescent material convert(s) a portion of light from the excitation light source and/or at least a portion of light from the silicate luminescent material of the present invention, to thereby give white light.

In a light emitting device according to a preferred embodiment of the invention, the light emitting element as the excitation light source has an emission spectrum having a peak value in a UV light to blue light range, and at least two light beams including at least a portion of light from the silicate luminescent material of the present invention and light from the second and/or the third and/or the fourth luminescent material are compounded, to thereby form white light.

In a light emitting device according to a preferred embodiment of the invention, the second and/or the third and/or the fourth luminescent material is/are: a doping rare earth activated oxynitride phosphor, and/or a doping rare earth activated nitride phosphor, and/or a doping rare earth activated halosilicate phosphor, and/or a doping rare earth activated phosphor of garnet structure, and/or a doping rare earth activated sulfide phosphor, and/or a doping rare earth activated oxide phosphor, and/or a doping rare earth activated oxide-sulfide phosphor, and/or a doping rare earth activated aluminate phosphor, and/or a doping Mn activated magnesium fluoroarsen(german)ate phosphor, and/or a doping rare earth activated borate phosphor, and/or a doping rare earth activated phosphate phosphor, and/or a doping rare earth activated halophosphate phosphor, and/or a doping rare earth activated titanate phosphor, and/or a doping rare earth activated thiogallate phosphor.

In a preferred embodiment of the present invention, the light emitting device is a luminescence-conversion LED comprising a luminescent material in direct or indirect contact with a chip.

In a preferred embodiment of the present invention, the light emitting device is an illuminating device comprising at least one LED that uses the luminescent material of the present invention.

In the present invention, the excitation spectra and emission spectra of the luminescent materials are determined by using F-4500 fluorescence spectrophotometer.

The relative spectrum power distributions and chromaticity coordinates of the LEDs are determined by using PMS-50 model UV-visible-near IR spectral analyzer.

MODE OF CARRYING OUT THE INVENTION

Examples of the invention are described below. It is understood that the invention is not limited by these examples.

EXAMPLE 1

| Raw materials | Weight (g) |
|---|---|
| $BaCO_3$ | 586.10 |
| MgO | 41.11 |
| $SiO_2$ | 120.78 |
| $Eu_2O_3$ | 1.76 |
| $Mn_3O_4$ | 3.81 |
| $NH_4F$ | 0.19 |
| $Li_2CO_3$ | 0.18 |

The raw materials according to the above composition were sufficiently mixed by a ball mill and then placed in a crucible. After cooling, the mixture was sintered in a furnace, through which a mixed gas consisting of 95% nitrogen and 5% hydrogen was passed, at 1200° C. for 6 hours. After cooling, the resultant sintered body was crushed, milled with a ball mill, and then sieved through a 325 mesh sieve, to give a luminescent material of the invention having a chemical composition of $2.97BaO.1.02MgO.2.01SiO_2:0.01 Eu^{2+}.0.05 Mn^{2+}.0.005F^-.0.005 Li^+$. The material had an excitation spectrum in the range of from 240 to 450 nm, and an emission spectrum in the range of from 400 to 760 nm with three emission peaks, of which peak wavelengths were at 438 nm, 502 nm and 617 nm, respectively.

EXAMPLES 2 to 36

Luminescent materials of Examples 2 to 36 were prepared following the procedure described in Example 1, with the kinds and amounts of the elements A and A' in the substrate composition being changed according to desired positions of emission peaks. The sintering temperature varied in the range of from 1000 to 1300° C. depending on the volume of the furnace, the weight of the materials, and the kind and formulation of the materials. The reducing atmosphere was provided by hydrogen gas, ammonia gas, a mixture of nitrogen and hydrogen, or a particulate carbon. Luminescent materials having two emission peaks with the following chemical compositions were obtained:

EXAMPLE 2

$2.03SrO.0.92MgO.1.0SiO_2:0.03Eu^{2+}.0.02F^-.0.07Li^+$

EXAMPLE 3

$3.07SrO.0.95MgO.2.05SiO_2:0.005Eu^{2+}.0.1Mn^{2+}.0.015F^-.0.035Li^+$

EXAMPLE 4

$1.9CaO.1.0MgO.1.9SiO_2:0.004Eu^{2+}.0.008Dy^{3+}.0.0001Cl^-.0.0005K^+$

EXAMPLE 5

$1.0BaO.2.0MgO.2.0SiO_2:0.01 Eu^{2+}.0.2Mn^{2+}.0.15F^-.0.05Cl^-.0.075Li^+$

EXAMPLE 6

$2.0BaO.1.0ZnO.2.1SiO_2:0.001 Eu^{2+}.0.05Mn^{2+}.0.0042F^-.0.08Li^+$

EXAMPLE 7

$3.0CaO.0.97MgO.2.0SiO_2:0.1 Eu^{2+}.0.03Mn^{2+}.0.115Cl^-.0.035Ag^+$

EXAMPLE 8

$2.03SrO.0.92MgO.1.0SiO_2:0.03Eu^{2+}.0.05Mn^{2+}.0.02F^-.0.07Li^+$

EXAMPLE 9

$2.97BaO.1.02MgO.2.01SiO_2:0.01 Eu^{2+}.0.135F^-.0.15Cl^-.0.055Li^+$

EXAMPLE 10

$1.0BaO.1.05CaO.1.05MgO2.0SiO_2:0.08Eu^{2+}.0.02F^-.0.05Li^+$

EXAMPLE 11

$3.1SrO.1.05MgO.1.98SiO_2:0.08Eu^{2+}.0.01F^-.0.05Li^+$

EXAMPLE 12

$1.5SrO.0.5SiO_2:0.05Eu^{2+}.0.08Mn^{3+}.0.06F^-.0.19Li^+$

EXAMPLE 13

$1.2BaO.1.5SrO.0.3CaO.1.05MgO.2.0SiO_2:0.01 Eu^{2+}.0.05Mn^{2+}.0.001F^-.0.015Li^+$

EXAMPLE 14

$2.0CaO.0.98MgO.1.0SiO_2:0.05Eu^{2+}.0.12Mn^{2+}.0.06F^-.0.06Li^+$

EXAMPLE 15

$2.0BaO.0.5MgO.0.5ZnO.1.8SiO_2:0.008Eu^{2+}.0.05Mn^{2+}.0.04F^-.0.05Li^+$

EXAMPLE 16

$0.5BaO.1.5CaO.1.03MgO.1.0SiO_2:0.1Eu^{2+}.0.23Mn^{2+}.0.03Cl^-.0.03Ag^+$

EXAMPLE 17

$2.0BaO.0.98MgO.1.0SiO_2:0.05Eu^{2+}.0.06F^-.0.06Li^+$

Example 18

$1.5BaO.1.5SrO.0.98MgO.2.0SiO_2:0.07Eu^{2+}.0.3Mn^{2+}.0.3F^-.0.15Li^+$

EXAMPLE 19

$2.0BaO.1.MgO.1.0SiO_2:0.05Eu^{2+}.0.13Mn^{2+}.0.06F^-.0.06Li^+$

EXAMPLE 20

$0.1SrO.1.9CaO.1.0MgO.2.0SiO_2:0.04Eu^{2+}.0.06F^-.0.06Li^+$

EXAMPLE 21

$2.0CaO.0.96MgO.1.0SiO_2:0.05Eu^{2+}.0.06F^-.0.06Li^+$

EXAMPLE 22

$2.3SrO.0.7BaO.1.0MgO.2.0SiO_2:0.05\ Eu^{2+}.0.1F^-.0.001\ Ag^+$

Example 23

$0.2BaO.0.5SrO.1.3CaO.1.0MgO.2.0SiO_2:0.06Eu^{2+}.0.01\ Mn^{2+}.0.09F^-.0.1\ Li^+$

EXAMPLE 24

$1.3BaO.3.7CaO.1.25SiO_2:0.05Eu^{2+}.0.13Mn^{2+}.0.06F^-.0.08Li^+$

EXAMPLE 25

$0.8BaO.1.3SrO.1.01\ MgO.1.0SiO_2:0.03Eu^{2+}.0.07Mn^{2+}.0.07F^-.0.05Li^+$

EXAMPLE 26

$2.0CaO.0.96MgO.1.0SiO_2:0.05Eu^{2+}.0.001Ce^{3+}.0.001Mn^{2+}.0.06F^-.0.06K^+$

EXAMPLE 27

$0.2BaO.0.5SrO.1.3CaO.1.0ZnO.2.0SiO_2:0.06\ Eu^{2+}.0.01\ Mn^{2+}.0.05F^-.\ 0.001K^+.0.005Na^+.0.001Li^+$

EXAMPLE 28

$1.5CaO.0.5MgO.1.5SiO_2:0.2Eu^{2+}.0.05Tm^{3+}.0.12Mn^{2+}.0.06F^-.0.06Ag^+.0.5La^{3+}$

EXAMPLE 29

$3.0BaO.1.8SiO_2:0.15Eu^{2+}.0.008Pr^{3+}.0.008Bi^{3+}.0.05Mn^{2+}.0.04F^-.0.05Li^+$

EXAMPLE 30

$1.4BaO.1.3SrO.0.1CaO.2.0SiO_2:0.03Eu^{2+}.0.06Mn^{2+}.\ 0.5F^-.0.015Li^+.0.4Ag^+$

EXAMPLE 31

$2.0BaO.0.98ZnO.1.0SiO_2:0.05Eu^{2+}.0.02Cl^-.0.03Br^-.\ 0.06Li^+$

EXAMPLE 32

$1.7BaO.1.2SrO.0.98ZnO.2.0SiO_2:0.03Eu^{2+}.0.3Mn^{2+}.\ 0.02F^-.0.15Na^+$

EXAMPLE 33

$0.6SrO.1.4CaO.2.0SiO_2:0.04Eu^{2+}.0.001Sm^{2+}.0.06F^-.\ 0.06Ag^+$

EXAMPLE 34

$0.2BaO.1.3CaO.0.4SrO.0.98MgO.1.0SiO_2:0.06Eu^{2+}.\ 0.13Mn^{2+}.0.04F^-.0.02Ag^+$

EXAMPLE 35

$1.9SrO.1.1BaO.2.0SiO_2:0.05Eu^{2+}.0.1F^-.0.003K^+$

EXAMPLE 36

$1.2BaO.1.3CaO.1.0MgO.0.5ZnO.2.5SiO_2:0.05Eu^{2+}.0.13Mn^{2+}.0.06F^-.0.06Li^+$

For the luminescent materials of the present invention having multiple emission peaks, their compositions influence their emission wavelengths in accordance with the following rules:

When $1 \leq (a+b)/c \leq 1.5$, alkaline earth metal elements influence the emission wavelengths of the luminescent materials by magnitudes in the following order: Ca>Ba>Sr. The more the amount of Ca is, the more remarkably the peak wavelengths of the luminescent materials having two or three emission peaks shift to the longer wavelength direction. The effect of Ba takes the second place. The peak wavelengths are the shortest if Sr is used. The influence of these elements on the peak wavelengths of the excitation spectra follows the same rule.

When $1.5 < (a+b)/c \leq 2$, alkaline earth metal elements influence the emission wavelengths of the luminescent materials by magnitudes in the following order: Ca>Sr>Ba. The more the amount of Ca is, the more remarkably the peak wavelengths of the luminescent materials having two or three emission peaks shift to the longer wavelength direction. The effect of Sr takes the second place. The peak wavelengths are the shortest if Ba is used. The influence of these elements on the peak wavelengths of the excitation spectra follows the same rule.

When $2 < (a+b)/c \leq 5$, alkaline earth metal elements influence the emission wavelengths of the luminescent materials by magnitudes in the following order: Ba>Sr>Ca. The more the amount of Ba is, the more remarkably the peak wavelengths of the luminescent materials having two or three emission peaks shift to the longer wavelength direction. The effect of Sr takes the second place. The peak wavelengths are the shortest if Ca is used. The influence of these elements on the peak wavelengths of the excitation spectra follows the same rule.

In addition, the increase in the amount of Mg will cause the excitation and emission wavelengths to shift to the shorter wavelength direction. If Zn is used to replace for a part of Mg, the excitation and emission wavelengths will shift to the longer wavelength direction as the amount of Zn increases.

Ignoring the individual influences of the elements A and A', increasing (a+b)/c ratio will cause the excitation and emission peak wavelengths to shift to the longer wavelength direction. Particularly, for the two or three emission peaks in the emission spectra of the luminescent materials of the invention, each peak shifts in accordance with this rule.

The positions of multiple emission peaks in the emission spectra, which were obtained by using an excitation light source of UV light to blue light region and by using the wavelength of the strongest excitation peak as the monitoring wavelength, of the luminescent materials of Examples 1-36 are listed in Table 1.

TABLE 1

| No. | The first emission peak wavelength (nm) | The second emission peak wavelength (nm) | The third emission peak wavelength (nm) |
|---|---|---|---|
| Example 1 | 438 | 502 | 617 |
| Example 2 | 461 | 556 | |
| Example 3 | 457 | 522 | 637 |
| Example 4 | 447 | 526 | |
| Example 5 | 401 | | 660 |
| Example 6 | 417 | 485 | |
| Example 7 | 468 | | 696 |
| Example 8 | 461 | 556 | 679 |
| Example 9 | 439 | 503 | |
| Example 10 | 433 | 530 | |
| Example 11 | 456 | 520 | |
| Example 12 | 458 | 568 | 670 |
| Example 13 | 462 | 558 | 672 |
| Example 14 | 446 | 545 | 662 |
| Example 15 | 426 | 512 | 593 |
| Example 16 | 451 | 547 | 667 |
| Example 17 | 475 | 569 | |
| Example 18 | 448 | 536 | |
| Example 19 | 473 | 566 | 681 |
| Example 20 | 439 | 519 | |
| Example 21 | 447 | 545 | |
| Example 22 | 460 | 553 | |
| Example 23 | 435 | 510 | 598 |
| Example 24 | 470 | 526 | 685 |
| Example 25 | 463 | 559 | 681 |
| Example 26 | 452 | 531 | 613 |
| Example 27 | 426 | 517 | 687 |
| Example 28 | 370 | 423 | 583 |
| Example 29 | 439 | 521 | 596 |
| Example 30 | 391 | 489 | 618 |
| Example 31 | 427 | 515 | |
| Example 32 | 446 | 531 | 654 |
| Example 33 | 401 | 483 | |
| Example 34 | 450 | 547 | 667 |
| Example 35 | 461 | 482 | |
| Example 36 | 434 | 516 | 597 |

It was found that, in the preparation of the luminescent materials, by adding $NH_4Cl$, $NH_4F$, $(NH_4)_2HPO_4$, glucose, urea, $BaF_2$, $CaF_2$, $ZnF_2$, ZnS, SrS, CaS, $SrSO_4$, $SrHPO_4$, $CaHPO_4$, $Li_2CO_3$, or the like in an amount of from 0 to 30% by weight of the raw materials to participate in the solid phase reaction, it was possible to improve the relative luminance of the materials to different extent.

EXAMPLE 37

| Raw materials | Weight(g) |
|---|---|
| $Sr(NO_3)_2$ | 253.96 |
| $Ca(OH)_2$ | 14.8 |
| $BaCO_3$ | 157.85 |
| $Mg(OH)_2 \cdot 4MgCO_3 \cdot 6H_2O$ | 10.07 |
| $H_4SiO_4$ | 96 |
| $H_3BO_3$ | 0.12 |
| $Eu(NO_3)_3$ | 16.9 |
| $MnO_2$ | 0.87 |
| $NH_4Cl$ | 2.68 |

The raw materials according to the above composition as well as 15% by weight of $(NH_4)_2HPO_4$, based on the weight of the raw materials, were sufficiently mixed by ball milling and then placed in a crucible. The crucible was embedded in another big crucible filled with carbon particles, and then the big crucible was placed in an electric furnace to sinter the mixture at 1250° C. for 5 hours. After cooling, the resultant sintered body was crushed, milled with a ball mill, and then sieved through a 325 mesh sieve, to give a luminescent material of the invention emitting yellow light: $1.2SrO.0.8 BaO.0.2CaO.0.1\ MgO.SiO_2:0.05Eu^{2+}.0.01\ Mn^{2+}.0.05Cl^{-}.0.45F^{-}.0.05Li^{+}$. Under the excitation of a UV light source of 386 nm, the material produced an emission spectrum with the main peaks positioned at 537 nm and 660 nm.

In the production process according to the present invention, the manner for adding various additional raw materials, if desired, is similar to that described in Example 37, while the kinds and amounts of the additional raw materials are selected according to the excitation and emission spectral ranges and relative luminance of the luminescent material to be produced.

The present invention further relates to an illuminating device that uses one or more of the luminescent materials of the present invention, particularly to a semiconductor LED, especially a white light LED, which uses a light emitting element having a main emission peak in the range of from 240 to 475 nm as an excitation light source. The protection scope claimed in the present invention is illustrated by the following concrete examples.

Figure 1:
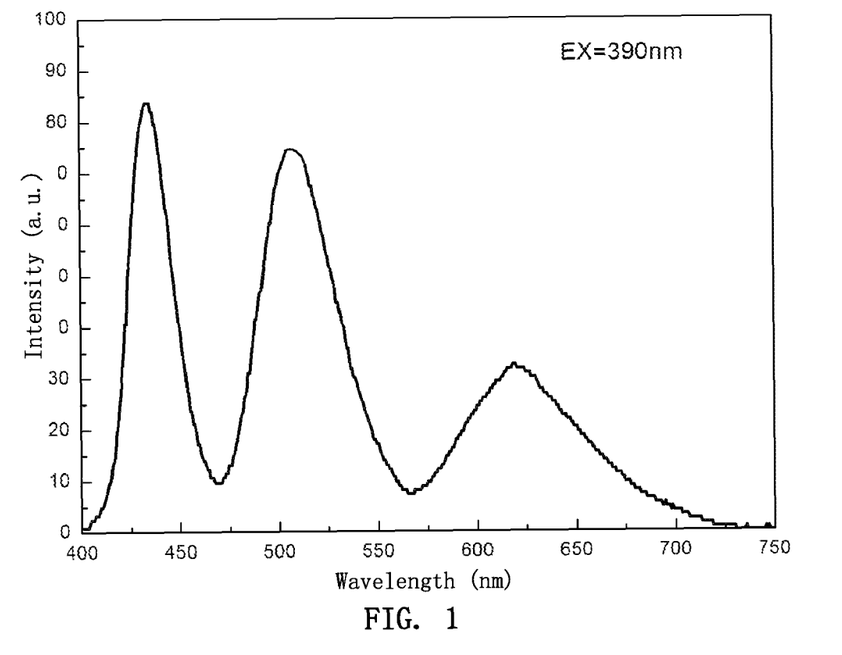
FIG. 1 shows the emission spectrum having three emission peaks of the luminescent material of Example 1.
Figure 2:
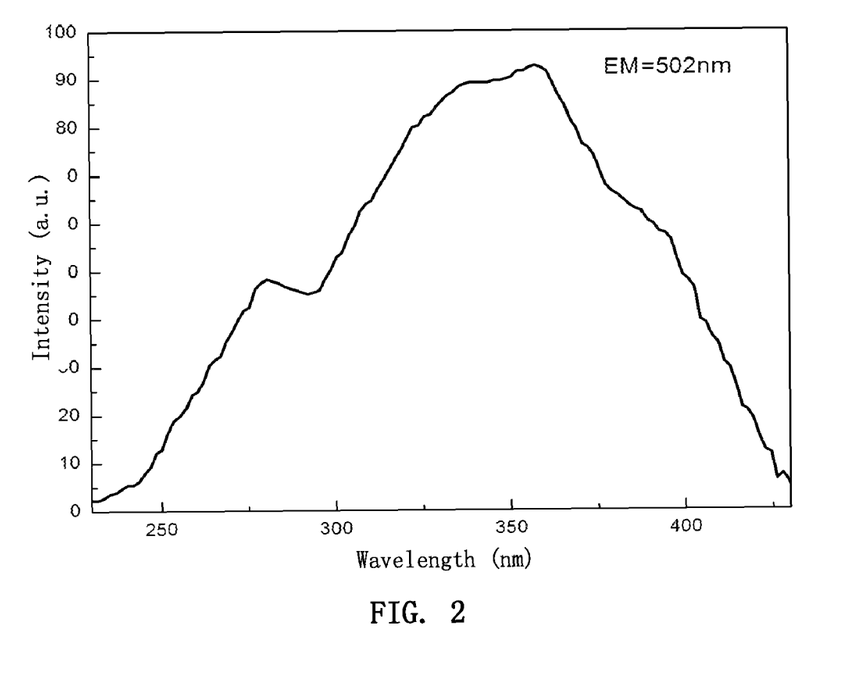
FIG. 2 shows the excitation spectrum of the luminescent material of Example 1.
Figure 3:
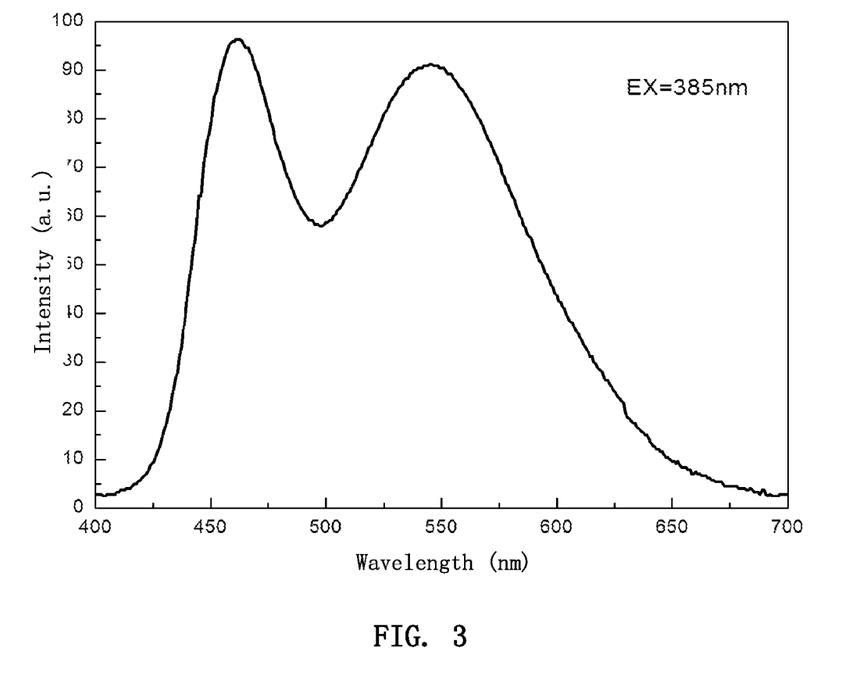
FIG. 3 shows the emission spectrum having two emission peaks of the luminescent material of Example 2.
Figure 4:
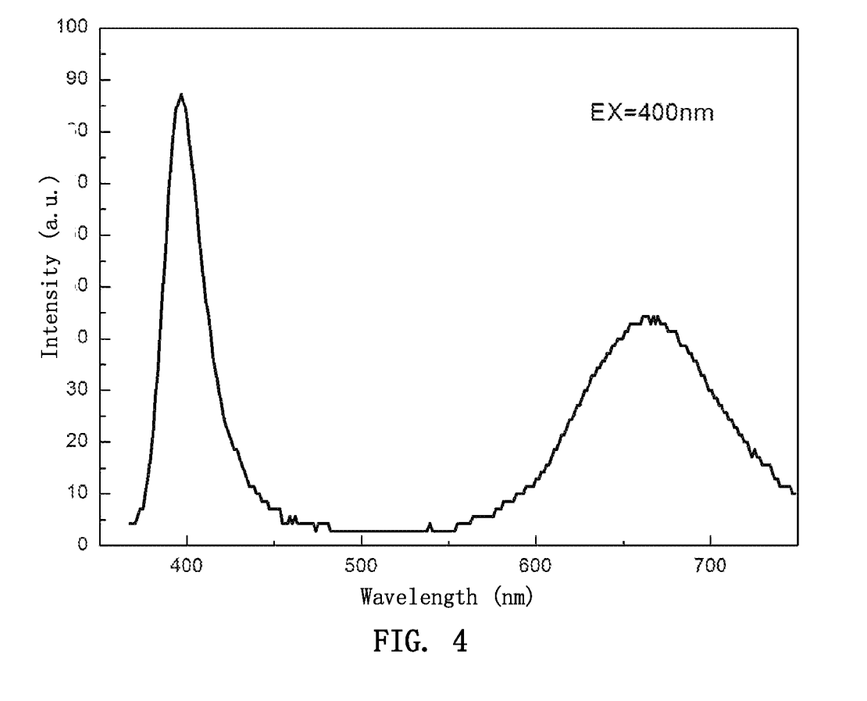
FIG. 4 shows the emission spectrum having two emission peaks of the luminescent material of Example 5.
Figure 5:
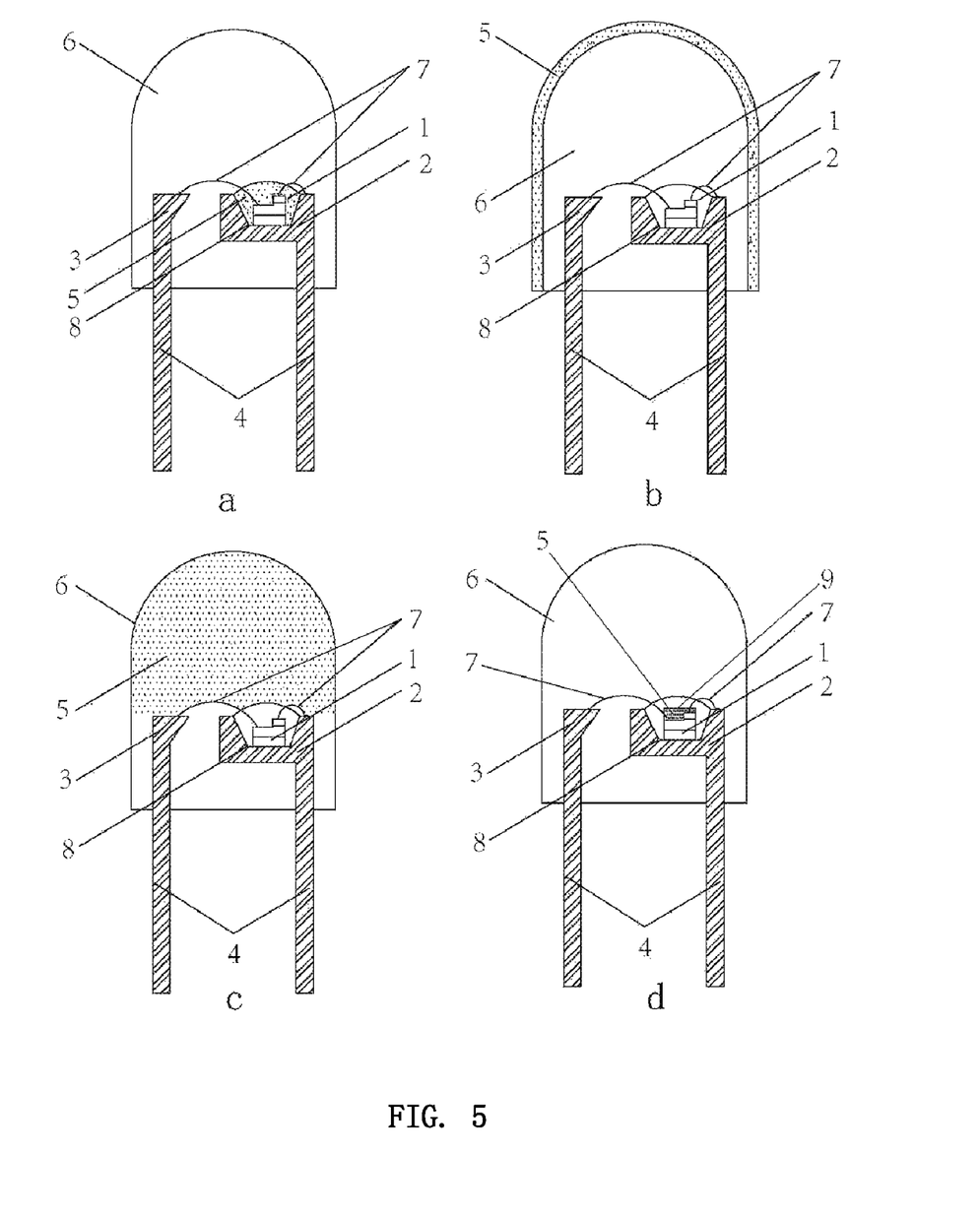
FIG. 5 shows schematically the structure of LEDs using a luminescent material.

With reference to FIG. 5, a LED according to the invention comprises a semiconductor light emitting chip 1, a cathode 2, an anode 3, pins 4, a luminescent material 5, a packaging material 6, leads 7, a reflective cup 8, and a film 9. The semiconductor light emitting chip is a GaInN chip or a GaN chip. The luminescent material comprises one or more of the silicate luminescent materials of the present invention. The packaging material is a transparent resin, and may be transparent epoxy resin, transparent silicone, and the like.

Among the figures, FIG. a shows a manner in which a luminescent material is in direct contact with a semiconductor light emitting chip, wherein the luminescent material is mixed with a transparent resin, and then homogenously coated on the semiconductor light emitting chip and filled the reflective cup. FIG. b shows a manner in which a luminescent material is in indirect contact with a semiconductor light emitting chip, wherein the luminescent material is homogenously distributed in an epoxy resin surface layer. FIG. c shows a manner in which a luminescent material is in indirect contact with a semiconductor light emitting chip, wherein the luminescent material is homogenously distributed in an epoxy resin over the semiconductor light emitting chip. FIG. d shows a manner in which a luminescent material is in indirect contact with a semiconductor light emitting chip, wherein the luminescent material is mixed with a transparent medium and formed into a film, and then the film is covered on the semiconductor light emitting chip.

EXAMPLE 38

A white light LED was prepared according to the LED packaging manner shown in the FIG. 5, a. Specifically, the packaging process was performed as follows: a chip having a matched main emission peak wavelength was selected according to the effective excitation wavelength range of the luminescent material. In this example, the semiconductor light emitting chip had a main emission peak wavelength of 390 nm, and the luminescent material was that obtained in Example 1. The selected chip was subjected to crystal mounting, wiring and drying. The luminescent material was weighed and homogenously mixed with a transparent epoxy resin in an appropriate ratio, and then the resultant mixture was homogenously coated on the semiconductor light emitting chip (applying-glue). A glue-applied lead cup was cured in a vacuum oven, and then inserted into a mold filled with the epoxy resin and cured in the vacuum oven, followed by demolding. The obtained device had a chromaticity coordinate of X=0.3293 and Y=0.3317, a color temperature of 5637K, and a color rendering index of 90. Under the excitation of UV light from the UV chip, the luminescent material emitted white light, of which spectrum had three peaks in blue light region, green region and red light region, respectively.

EXAMPLE 39

A white light LED was prepared according to the LED packaging manner shown in the FIG. 5, b. In this example, the semiconductor light emitting chip had a main emission peak wavelength of 400 nm, and the luminescent material was obtained by mixing the luminescent materials obtained in Examples 7 and 10 in an appropriate ratio. The packaging process was similar to that described in Example 38, except that the luminescent material was homogenously distributed in an epoxy resin surface layer. The emission spectrum of this white light LED consisted of spectra of blue light, green light, and red light emitted from the luminescent material after it was excited by the UV light from the UV chip. The white light LED had a chromaticity coordinate of X=0.3457 and Y=0.3493, and a color temperature of 4962K.

EXAMPLE 40

A white light LED was prepared according to the LED packaging manner shown in the FIG. 5, c. In this example, the semiconductor light emitting chip had a main emission peak wavelength of 380 nm, and the luminescent material was obtained by mixing the luminescent material obtained in Example 6, the luminescent material obtained in Example 10, and a doping rare earth activated gadolinium magnesium borate phosphor ($Gd_{0.65}MgB_9O_{16}$:$Eu_{0.35}$, having a main emission peak wavelength of 623 nm) in an appropriate ratio. The packaging process was similar to that described in Example 38, except that the luminescent material was homogenously distributed in the epoxy resin over the semiconductor light emitting chip. The emission spectrum of this white light LED consisted of the spectra of blue light and a portion of green light respectively emitted by the luminescent material of Example 6 and that of Example 10 after being excited, and the spectrum of red light emitted by the gadolinium magnesium borate phosphor after being excited by absorbing a portion of green light from the luminescent material of Example 7. The white light LED had a chromaticity coordinate of X=0.2947 and Y=0.3013, and a color temperature of 8096K.

LEDs can be prepared according to any of the LED packaging manners shown in FIGS. 5, a, b, c, and d. The packaging processes are similar to that described in Examples 38, 39, and 40. However, the luminescent material can be selected according to the following principles:

(1) The effective excitation wavelength range of the luminescent material should match with the main emission peak wavelength of the semiconductor light emitting chip and/or the main emission peak wavelength of other phosphor(s) co-used.

(2) In the situation that the main emission peak wavelength of the semiconductor light emitting chip has been determined, the luminescent material can be selected according to the desired color of the light emitted by the LED product.

(3) On the premise of using at least one of the silicate luminescent materials of the present invention, a second luminescent material and/or a third luminescent material and/or a fourth luminescent material other than those of the present invention can be selected according to the desired color of the light emitted by the LED product.

Examples of the luminescent material that can be used as the second luminescent material and/or the third luminescent material and/or the fourth luminescent material are: doping rare earth activated oxynitride phosphors, doping rare earth activated nitride phosphors, doping rare earth activated halosilicate phosphors, doping rare earth activated phosphors of garnet structure, doping rare earth activated sulfide phosphors, doping rare earth activated oxide phosphors, doping rare earth activated oxide-sulfide phosphors, doping rare earth activated aluminate phosphors, doping Mn activated magnesium fluoroarsen(german)ate phosphors, doping rare earth activated borate phosphors, doping rare earth activated phosphate phosphors, doping rare earth activated halophosphate phosphors, doping rare earth activated titanate phosphors, and doping rare earth activated thiogallate phosphors.

The color of the light emitted by the prepared LED is determined by the emission spectrum and relative luminance of the semiconductor light emitting chip used as well as the emission spectra and relative luminance of the luminescent material(s) and phosphor(s) used.

As compared with the prior art, the silicate luminescent materials of the present invention have the following outstanding characteristic: under the excitation of a light emitting element having emissions in the UV light to blue light range of from 240 to 475 nm, the luminescent materials can give emission spectra having two or more emission peaks in the range of from 370 to 760 nm. Moreover, by finely controlling the amounts and proportions of substrates, activating agents, sensitizing agents, and additives, the peak wavelengths and intensities of the two or three emission peaks of the luminescent materials can be finely controlled, so that the light-color parameters, such as luminescent efficiency, color temperature and color rendering index, of the produced white light can be finely controlled. Meanwhile, since the silicate luminescent materials of the present invention have multiple emission peaks, the kind and number of the luminescent materials used in packaging processes of white light LEDs can be greatly reduced.

What is claimed is:

1. A luminescent material, in particular a luminescent material used in light emitting devices including LED, characterized in that the luminescent material mainly comprises a silicate and an activating agent ion, and has a main chemical composition expressed by the following formula:

wherein, A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Bi, Sm, Sn, Y, Lu, Ga, Sb, Tb, Mn and Pb; M is selected from the group consisting of $Cl^-$, $F^-$, $Br^-$, $I^-$, and combinations thereof; N is selected from the group consisting of $Li^+$, $Na^+$, $K^+$, $Ag^+$, and combinations thereof; a, b, c, x, y, z, and $\delta$ are molar coefficients, $1.0 \leq a \leq 5.0$; $0 \leq b \leq 2.0$; $0.5 \leq c \leq 2.5$; $0.001 \leq x \leq 0.2$; $0 \leq y \leq 0.5$; $0 < z < 0.5$; $0 < \delta < 0.2$; and wherein $1 \leq (a+b)/c \leq 4$; and in that under the excitation of a light emitting element as an excitation light source that has an emission spectrum in UV light to blue light region of from 240 to 475 nm, the luminescent material absorbs at least a portion of light from the excitation light source and thereby generates an emission spectrum having at least two peaks in a range of from 370 to 760 nm, with the emissions combining to give white light.

2. The luminescent material according to claim 1, characterized in that in the chemical composition expressing formula, A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Sm, Lu, Ga, Bi, Sb, Tb and Mn; M is selected from the group consisting of $Cl^-$, $F^-$, and combinations thereof; N is $Li^+$ or $Ag^+$ or a combination thereof, and wherein $1.0 \leq a \leq 4.0$; $0 \leq b \leq 2.0$; $0.7 \leq c \leq 2.2$; $0.001 \leq x \leq 0.1$; $0 \leq y \leq 0.25$; $0.001 \leq z < 0.2$; $0.001 \leq \delta < 0.1$; and $1.5 \leq (a+b)/c \leq 3$.

3. The luminescent material according to claim 1, characterized in that the luminescent material is excited by light from an excitation light source that has an emission peak in a UV light to bluish violet light range of from 240 to 455 nm, and generates an emission spectrum having two peaks in a range of from 370 to 760 nm.

4. The luminescent material according to claim 1, characterized in that the luminescent material is excited by light from an excitation light source that has an emission peak in a UV light to bluish violet light range of from 240 to 455 nm, and generates an emission spectrum having three peaks in a range of from 370 to 760 nm.

5. The luminescent material according to claim 1, characterized in that the luminescent material is excited by light from an excitation light source that has an emission peak in a blue light region of from 455 to 475 nm, and generates an emission spectrum having two peaks in a range of from 370 to 760 nm.

6. The luminescent material according to claim 1, characterized in that the luminescent material is excited by light from an excitation light source that has an emission peak in a blue light region of from 455 to 475 nm, and generates an emission spectrum having three peaks in a range of from 370 to 760 nm.

7. The luminescent material according to claim 1, characterized in that the luminescent material is excited by light from an excitation light source that has an emission peak in a UV light to blue light range of from 240 to 475 nm, and the emission peak wavelength of the luminescent material is longer than the wavelength of the emission peak at long wavelength side of the excitation light source.

8. A light emitting device comprising a light emitting element used as an excitation light source and luminescent materials capable of converting at least a portion of light from the excitation light source, characterized in that:
the light emitting element has an emission spectrum with a peak in a UV light to blue light range of from 240 to 475 nm, at least a portion of the wavelengths of the first emission spectrum of the light emitting element are altered so as to give a second emission spectrum of the luminescent materials having at least two peaks in a wavelength range of from 370 to 760 nm, and at least one of the luminescent materials is one having a chemical composition expressed by the formula: $aAO.bA'O.cSiO_2:xEu.yLn.zM.\delta N$, wherein, A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Bi, Sm, Sn, Y, Lu, Ga, Sb, Tb, Mn and Pb; M is selected from the group consisting of $Cl^-$, $F^-$, $Br^-$, $I^-$, and combinations thereof; N is selected from the group consisting of $Li^+$, $Na^+$, $K^+$, and combinations thereof; a, b, c, d, x, y, z, and $\delta$ are molar coefficients, $1.0 \leq a \leq 5.0$; $0 \leq b \leq 2.0$; $0.5 \leq c \leq 2.5$; $0.001 \leq x \leq 0.2$; $0 \leq y \leq 0.5$; $0 < z < 0.5$; $0 < \delta < 0.2$; and wherein $1 \leq (a+b)/c \leq 4$.

9. The light emitting device according to claim 8, characterized in that the light emitting element as the excitation light source has at least one emission peak in the UV light to blue light range of from 240 to 475 nm in which the luminescent material has an absorption band.

10. The light emitting device according to claim 8, characterized in that the luminescent layer of the light emitting element is made of a nitride semiconductor or an In-containing nitride semiconductor.

11. The light emitting device according to claim 8, characterized in that in the chemical composition expressed by the formula $aAO.bA'O.cSiO_2:xEu.yLn.zM.\delta$ N, A is selected from the group consisting of Sr, Ca, Ba, and combinations thereof; A' is selected from the group consisting of Mg, Zn, and combinations thereof; Ln is ion(s) of at least one element selected from the group consisting of Nd, Dy, Ho, Tm, La, Ce, Er, Pr, Sm, Lu, Ga, Bi, Sb, Tb and Mn; M is selected from the group consisting of $Cl^-$, $F^{31}$, and combinations thereof; N is $Li^+$ or $Ag^+$ or a combination thereof, and wherein $1.0 \leq a \leq 4.0$; $0 \leq b \leq 2.0$; $0.7 \leq c \leq 2.2$; $0.001 \leq x \leq 0.1$; $0 \leq y \leq 0.25$; $0.001 \leq z \leq 0.2$; $0.001 \leq \delta \leq 0.1$; and $1.5 \leq (a+b)/c \leq 3$.

12. The light emitting device according to claim 8, characterized in that the light emitting element has an emission spectrum having a peak in the UV light to blue light range of from 240 to 475 nm; the luminescent material is one or a combination of the silicate luminescent materials having the chemical composition expressed by the formula: $aAO.bA'O.cSiO_2:xEu.yLn.zM.\delta$ N and the luminescent material absorbs at least a portion of light from the excitation light source and/or from other luminescent material in the combination and converts it so as to alter at least a portion of the wavelengths of the emission spectrum of the light emitting element to give a different emission spectrum having at least two peaks in the wavelength range of from 370 to 760 nm, thereby giving white light.

13. The light emitting device according to claim 8, characterized in that the luminescent material further comprises a second luminescent material and/or a third luminescent material and/or a fourth luminescent material, which is/are used together with at least one of the silicate luminescent materials having the chemical composition expressed by the formula: aAO.bA'O.cSiO$_2$:xEu.yLn.zM.δ N, the second luminescent material and/or the third luminescent material and/or the fourth luminescent material converting a portion of light from the excitation light source and/or at least a portion of light from the silicate luminescent material having a chemical composition expressed by the formula: aAO.bA'O.cSiO$_2$: xEu.yLn.zM.δ N, to thereby give white light.

14. The light emitting device according to claim 8, characterized in that the light emitting element as the excitation light source has an emission spectrum having a peak value in a UV light to blue light range, and at least two light beams including at least a portion of light from the silicate luminescent material and light from the second and/or the third and/or the fourth luminescent material are compounded, to thereby form white light.

15. The light emitting device according to claim 8, characterized in that the second and/or the third and/or the fourth luminescent material is/are: a doping rare earth activated oxynitride phosphor, and/or a doping rare earth activated nitride phosphor, and/or a doping rare earth activated halosilicate phosphor, and/or a doping rare earth activated phosphor of garnet structure, and/or a doping rare earth activated sulfide phosphor, and/or a doping rare earth activated oxide phosphor, and/or a doping rare earth activated oxide-sulfide phosphor, and/or a doping rare earth activated aluminate phosphor, and/or a doping Mn activated magnesium fluoroarsen(german)ate phosphor, and/or a doping rare earth activated borate phosphor, and/or a doping rare earth activated phosphate phosphor, and/or a doping rare earth activated halophosphate phosphor, and/or a doping rare earth activated titanate phosphor, and/or a doping rare earth activated thiogallate phosphor.

16. The light emitting device according to claim 8, characterized in that the light emitting device is a luminescence-conversion LED, in which the luminescent material is in direct or indirect contact with a chip.

17. The light emitting device according to claim 8, characterized in that the light emitting device is an illuminating device comprising at least one LED that uses the luminescent material.

* * * * *